(12) United States Patent
Yamamoto et al.

(10) Patent No.: US 10,727,101 B2
(45) Date of Patent: Jul. 28, 2020

(54) MOUNTING TABLE AND PLASMA PROCESSING APPARATUS

(71) Applicant: Tokyo Electron Limited, Tokyo (JP)

(72) Inventors: Kyouhei Yamamoto, Miyagi (JP); Taira Takase, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 232 days.

(21) Appl. No.: 14/165,964

(22) Filed: Jan. 28, 2014

(65) Prior Publication Data

US 2014/0209245 A1 Jul. 31, 2014

Related U.S. Application Data

(60) Provisional application No. 61/769,367, filed on Feb. 26, 2013.

(30) Foreign Application Priority Data

Jan. 31, 2013 (JP) ................. 2013-016703

(51) Int. Cl.
*H01J 37/32* (2006.01)
*H01L 21/683* (2006.01)
*H01L 21/67* (2006.01)

(52) U.S. Cl.
CPC .... *H01L 21/6831* (2013.01); *H01J 37/32091* (2013.01); *H01L 21/67109* (2013.01)

(58) Field of Classification Search
USPC ................. 118/728–733; 156/345.51–345.55
See application file for complete search history.

(56) References Cited

U.S. PATENT DOCUMENTS 5,376,213 A * 12/1994 Ueda ................... C23C 16/4586
156/345.27
5,578,532 A * 11/1996 van de Ven ............. C23C 16/04
118/728

(Continued)

FOREIGN PATENT DOCUMENTS

JP 2004-104113 A 4/2004
JP 2004-511901 A 4/2004

(Continued)

OTHER PUBLICATIONS

"penetrate, v.". OED Online. Jun. 2016. Oxford University Press. http://www.oed.com/view/Entry/140088?redirectedFrom=penetrate (accessed Aug. 13, 2016).*

(Continued)

*Primary Examiner* — Karla A Moore
*Assistant Examiner* — Tiffany Z Nuckols
(74) *Attorney, Agent, or Firm* — Pearne & Gordon LLP

(57) ABSTRACT

A mounting table includes a base member, having a rear surface and a front surface facing the rear surface, in which a coolant path is formed, a groove portion having a bottom surface within the base member being annularly formed on the front surface, the base member being divided into a cylindrical inner base member portion positioned at an inner side of the groove portion and an annular outer base member portion positioned at an outer side of the groove portion by the groove portion; an annular focus ring supported by the outer base member portion, the annular focus ring having, at an inner side surface thereof, a protrusion that is protruded radially and inwardly to cover the groove portion; a first heat transfer member provided between the mounting surface and the coolant path; and a second heat transfer member provided between the focus ring and the coolant path.

19 Claims, 10 Drawing Sheets

(56) References Cited

U.S. PATENT DOCUMENTS

| | | | | |
|---|---|---|---|---|
| 5,595,241 | A * | 1/1997 | Jelinek | H01L 21/67109 118/725 |
| 6,206,976 | B1 * | 3/2001 | Crevasse | C23C 16/45521 118/500 |
| 6,795,292 | B2 * | 9/2004 | Grimard | H01L 21/67103 361/234 |
| 2004/0168767 | A1 * | 9/2004 | Kanno | H01J 37/32082 156/345.27 |
| 2004/0261946 | A1 * | 12/2004 | Endoh | H01J 37/32082 156/345.15 |
| 2006/0254717 | A1 * | 11/2006 | Kobayashi | C23F 4/00 156/345.44 |
| 2008/0149598 | A1 * | 6/2008 | Hayashi | H01J 37/32522 216/67 |
| 2010/0018648 | A1 * | 1/2010 | Collins | H01J 37/32082 156/345.24 |
| 2010/0326957 | A1 * | 12/2010 | Maeda | H01J 37/20 216/67 |
| 2012/0040097 | A1 * | 2/2012 | Volf | C23C 16/4586 427/255.5 |

FOREIGN PATENT DOCUMENTS

| | | |
|---|---|---|
| JP | 3155802 U | 11/2009 |
| JP | 3155802 U * | 12/2009 |
| KR | 10-0807136 B1 | 2/2008 |
| WO | 02/31219 A1 | 4/2002 |

OTHER PUBLICATIONS

Takebayashi et al. "Wafer mounting apparatus for, e.g. plasma etching apparatus, has ring heater that is positioned spaced apart from metal cooling plate positioned on back surface of electrostatic chuck mounted with wafer." Nov. 11, 2011. Derwent. Printed on Oct. 26, 2017. (Year: 2009).*

Takebayashi. 2009. JP3155802U English Machine Translation. Year: 2009. Accessed from https://www.j-platpat.inpit.go.jp/ dated Oct. 17, 2019.*

* cited by examiner

MOUNTING TABLE AND PLASMA PROCESSING APPARATUS

CROSS-REFERENCE TO RELATED APPLICATION

This application claims the benefit of Japanese Patent Application No. 2013-016703 filed on Jan. 31, 2013, and U.S. Provisional Application Ser. No. 61/769,367 filed on Feb. 26, 2013, the entire disclosures of which are incorporated herein by reference.

TECHNICAL FIELD

The embodiments described herein pertain generally to a mounting table and a plasma processing apparatus.

BACKGROUND

As a plasma processing apparatus, there has been known an apparatus including a mounting table configured to mount thereon a target object (work piece) (for example, a semiconductor wafer, a glass substrate, and the like) in a processing chamber (see, for example, Patent Document 1). The plasma processing apparatus described in Patent Document 1 includes an electrostatic chuck configured to mount a wafer thereon. The electrostatic chuck has a central portion on which a wafer is mounted, and a flange portion formed to surround the central portion. Above the flange portion, an annular focus ring is provided to be apart from an upper surface of the flange portion. That is, there is a gap between a lower surface of the focus ring and the upper surface of the flange portion. Further, it is described that a heater is embedded in the focus ring, and a minute space for introducing a cooling gas is formed at the lower surface of the focus ring. The electrostatic chuck is connected to a RF power supply.

Patent Document 1: Specification of U.S. Pat. No. 6,795,292

In microprocessing for manufacturing a semiconductor device or a FPD (Flat Panel Display) using plasma, it is very important to control a temperature and a temperature distribution of a target object as well as a plasma density distribution on the target object. If the temperature of the target object is not appropriately controlled, uniformity of a surface reaction on the target object and uniformity of process characteristics cannot be secured. As a result, a production yield of semiconductor devices or display devices is reduced.

In order to control a temperature of a target object, there has been widely used a heater manner in which a heating element that generates heat when an electric current is applied is mounted on a mounting table and Joule heat generated from the heating element is controlled. Further, there has been widely used a method in which heat of a target object is absorbed by forming a coolant path within a mounting table. Furthermore, as described in Patent Document 1, in order to control a temperature of a focus ring, there has been provided a configuration in which a heater is embedded in a focus ring and a coolant for absorbing heat is introduced to a lower surface of the focus ring. By using these temperature control units, a set temperature of a target object and a set temperature of a focus ring are required to be maintained in an optimum temperature range for each processing condition of the target object.

The importance of the control of a focus ring temperature will be described below. FIG. 6A and FIG. 6B are graphs showing a dependency of a working shape of a wafer as a target object on a distance from a center of the wafer (wafer center). FIG. 6A is a graph showing a dependency of a hole depth on a distance from the wafer center. The horizontal axis represents a distance from the wafer center, and the longitudinal axis represents a hole depth. FIG. 6B is a graph showing a dependency of a hole shape on a distance from the wafer center. The horizontal axis represents a distance from the wafer center, and the longitudinal axis represents top CD. In both FIG. 6A and FIG. 6B, each temperature of a focus ring is plotted. As shown in FIG. 6A and FIG. 6B, a temperature of a focus ring greatly affects a hole depth particularly at a wafer end portion (for example, 145 mm to 147 mm). FIG. 7A and FIG. 7B are graphs showing a dependency of an etching rate (E/R) on a wafer position. FIG. 7A is a graph in a case where a temperature of a focus ring is not controlled. FIG. 7B is a graph in a case where a temperature of a focus ring is controlled to be low. In both FIG. 7A and FIG. 7B, X-axis and Y-axis are orthogonal to each other on the wafer, and results measured along these axes are plotted on the graphs. According to a comparison between FIG. 7A and FIG. 7B, in the case where a temperature of a focus ring is controlled to be low, an etching rate at the wafer end portion (for example, 145 mm to 147 mm) is closer to an etching rate at the wafer center. Thus, uniformity of an etching rate in the entire surface of the wafer is improved.

As such, in order to obtain uniformity of process accuracy in the entire surface of the target object, a temperature control unit for a focus ring as shown in the plasma processing apparatus described in Patent Document 1 as well as a temperature control unit for a target object needs to be provided. As a conventional mounting table, for example, a mounting table depicted in FIG. 8 may be considered. As depicted in FIG. 8, a mounting table 200 includes an aluminum base member 30 having therein coolant paths 200e and 200d, and an electrostatic chuck 60 having a wafer mounting surface 60d and a focus ring mounting surface 60e. The base member 30 serves as a high frequency electrode, and the electrostatic chuck 60 is made of ceramic or the like and provided on the aluminum base member 30. The electrostatic chuck 60 has a central portion 60g and a flange portion 60h formed to surround the central portion 60g. An upper surface of the central portion 60g serves as the wafer mounting surface 60d, and an upper surface of the flange portion 60h serves as the focus ring mounting surface 60e. Heaters 60c and 7c are provided under the wafer mounting surface 60d and the focus ring mounting surface 60e, for example, within the electrostatic chuck 60, and configured to independently control temperatures of the wafer mounting surface 60d and the focus ring mounting surface 60e, respectively. In order to control temperatures of the wafer and the focus ring to be increased, the heaters 60c and 7c supply heat to the wafer mounting surface 60d and the focus ring mounting surface 60e, respectively. Further, in order to control temperatures of the wafer and the focus ring to be decreased, heat is transferred and absorbed from the wafer mounting surface 60d and the focus ring mounting surface 60e to the coolant paths 200e and 200d within the aluminum base member 30, i.e. in a vertical direction, respectively.

A temperature control of the mounting table configured as described above is verified, and a result of the verification is shown in FIG. 9. FIG. 9 is a graph showing temperatures measured at each distance (radius) from the center of the mounting table, and the horizontal axis represents a radius, and the longitudinal axis represents a temperature. In FIG. 9, a radius on the inner side of a radius indicated by a dotted line corresponds to a wafer region on which the wafer is mounted, and a radius on the outer side of the radius indicated by the dotted line corresponds to a FR region on which the focus ring is mounted. In FIG. 9, a heater in the wafer region is turned off, and a heater in the FR region is turned on. That is, there is provided a measurement result in a case where a wafer temperature is not controlled, but only a focus ring temperature is controlled. As shown in FIG. 9, thermal interference occurs in the vicinity of the radius indicated by the dotted line, i.e. between the wafer region and the FR region, and a temperature at a wafer end portion is increased. That is, when the wafer mounting surface and the focus ring mounting surface are formed on the electrostatic chuck, there occurs thermal diffusion from a focus ring side to a wafer side. Heat introduced into the electrostatic chuck flows not only in the vertical direction starting from the electrostatic chuck to the coolant paths in the aluminum base member but also in a horizontal direction (diametrical direction of the mounting table) within the electrostatic chuck and at a portion above the coolant paths within the aluminum base member.

For this reason, as described in Patent Document 1, by forming a gap between the lower surface of the focus ring and the upper surface of the flange portion of the electrostatic chuck, the focus ring is not in direct contact with the electrostatic chuck. With this configuration, the direct thermal diffusion from the focus ring side to the electrostatic chuck side may be suppressed. However, if members supporting the focus ring and the electrostatic chuck are thermally connected to each other, indirect thermal interference may occur unless a height position of a coolant path is considered. For this reason, there has been demanded a unit capable of independently controlling a temperature of a target object and a temperature of a focus ring.

Further, even if a temperature of the wafer mounting surface and a temperature of the focus ring mounting surface are controlled separately, there are problems to be solved as follows. Recently, a set temperature of the focus ring has been demanded to be higher than a set temperature of the target object. By way of example, there has been demanded to generate a temperature difference of about 100° C. or more. However, if a temperature of the heater right under the wafer mounting surface is controlled to have a temperature difference of about 40° C. or more from a temperature of the heater right under the focus ring mounting surface, the electrostatic chuck made of ceramic may be damaged due to the thermal expansion. FIG. 10 shows a result of verification of a maximum stress generated at the electrostatic chuck due to a temperature difference. The horizontal axis represents a temperature difference, and the longitudinal axis represents a maximum stress generated at a measurement position. The square legend (temperature difference: 40° C., maximum stress: 388 MPa) shows the case where a temperature of the focus ring is controlled to be lower than a temperature of the target object, and the other legend shows the case where a temperature of the focus ring is controlled to be higher than a temperature of the target object. A reference value of a maximum stress at which damage occurs is 190 MPa. As shown in FIG. 10, when a temperature difference is 40° C. or more, a maximum stress exceeds the reference value of 190 MPa. Such damage is likely to occur at a position where a thickness of the electrostatic chuck is changed. By way of example, as depicted in FIG. 8, such damage is likely to occur at a step-shaped portion at the boundary between the wafer mounting surface 60d and the focus ring mounting surface 60e. Further, since a heater cannot be arranged at a portion where the electrostatic chuck is screwed to the aluminum base member, such a temperature difference can be easily generated. As a result, damage is likely to occur at such a portion. By way of example, as depicted in FIG. 8, when the aluminum base member 30 is connected to a supporting member 40 with a screw 8e, the aluminum base member 30 is screwed with the supporting member 40 by inserting the screw 8e into a through hole 60i formed within the flange portion 60h of the electrostatic chuck 60, a through hole 30a (whose inner surface may be screw-cut) formed within the aluminum base member 30, and an insertion through hole 40a formed within the supporting member 40 and having a screw-cut inner surface. In this case, since the through hole 60i is formed within the electrostatic chuck 60, the heater 7c cannot be arranged therein. Therefore, a temperature difference can be easily generated at a portion where the through hole 60i is formed. As a result, damage is likely to occur at this portion.

Further, in the mounting table as described in Patent Document 1, a member constituting the wafer mounting surface is different from a member constituting the focus ring mounting surface. Therefore, it is possible to reduce an effect of thermal stress deformation caused by the thermal expansion difference. By way of example, it is proposed to separately prepare an inner ceramic plate configured to mount a wafer and an outer ceramic plate configured to annularly surround the inner ceramic plate. Further, heating is controlled with a heater embedded in each of the ceramic plates. Furthermore, an aluminum plate including a coolant path is provided in each of lower layers of the inner and outer ceramic plates, and a heat flux is controlled in the vertical direction.

However, in the above-described configuration, a RF power needs to be applied to each of the separately provided aluminum plates. Otherwise, it is necessary to apply a power to each of the aluminum plates through divided power supply lines, each having a matcher, from a single RF power supply. In order to perform a complicated application sequence such as simultaneous application of a RF power in a pulse waveform, or the like, a configuration of an apparatus becomes complicated. Therefore, it is desirable to apply a power from a single RF power supply. Further, since a wafer mounting member and a focus ring mounting member are different in an area and a thickness, the wafer mounting member and the focus ring mounting member have conductance components greatly different from each other. By way of example, if each of the wafer mounting member and the focus ring mounting member includes a ceramic plate, a conductance component greatly varies depending on an area and a thickness of the corresponding ceramic plate. For this reason, if a power supply line is divided into a power supply line connected to the wafer and a power supply line connected to the focus ring, a RF power may not be distributed appropriately. As a result, a sheath field generated at a plasma interface may be non-uniform on the surface of the wafer and the surface of the focus ring. In such case, there is a problem that a desired semiconductor device cannot be manufactured.

As such, in the present technical field, there have been demanded a mounting table and a plasma processing apparatus capable of independently controlling the temperature of the target object and the temperature of the focus ring, generating a great temperature difference between the target object and the focus ring, which is limited by the thermal stress deformation, and generating a uniform sheath field on the surface of the wafer and the surface of the focus ring in a simple configuration.

SUMMARY

In one example embodiment, a mounting table that mounts thereon a target object includes a base member, a mounting member, a focus ring, a first heat transfer member and a second heat transfer member. The base member has a rear surface and a front surface facing the rear surface, and a coolant path is formed in the base member. Further, the rear surface is connected to a power supply member configured to apply a voltage, and a groove portion having a bottom surface within the base member is annularly formed on the front surface when viewed from a direction perpendicular to the front surface. Moreover, the base member is divided into a cylindrical inner base member portion positioned at an inner side of the groove portion and an annular outer base member portion positioned at an outer side of the groove portion by the groove portion. The mounting member is supported by the inner base member portion and has a mounting surface on which the target object is mounted. The annular focus ring is supported by the outer base member portion and arranged to surround the mounting surface when viewed from a direction perpendicular to the mounting surface. Further, the annular focus ring has, at an inner side surface thereof, a protrusion that is protruded radially and inwardly to cover the groove portion when viewed from the direction perpendicular to the mounting surface. The first heat transfer member is provided between the mounting surface and the coolant path. The second heat transfer member is provided between the focus ring and the coolant path.

In this mounting table, the mounting member is supported by the inner base member portion, and the focus ring is supported by the outer base member portion. By the groove portion (space) which separates the inner base member portion and the outer base member portion, the mounting member and the focus ring are thermally separated from each other, so that heat transfer in a horizontal direction (in a diametrical direction of the mounting table) is suppressed. For this reason, it is possible to independently control a temperature of the target object and a temperature of the focus ring. Further, since the inner base member portion and the outer base member portion are separated from each other with the space, i.e., the groove portion, even if there is a difference in the thermal expansion between the inner base member portion and the outer base member portion and between the mounting member and the focus ring, the constituent components are not damaged by the thermal stress deformation. As a result, it is possible to generate a great temperature difference between the target object and the focus ring, which is limited by the thermal stress deformation. Furthermore, since the power supply member is connected to the rear surface of the base member and the groove portion includes the bottom surface within the base member, the inner base member portion and the outer base member portion are connected to each under the groove portion. As such, the inner base member portion and the outer base member portion are connected to each other as a RF circuit. Therefore, it is possible to generate a uniform sheath field on a surface of the target object and a surface of the focus ring in a simple configuration. Moreover, since plasma to be introduced into the groove portion is blocked by the protrusion formed at the inner side surface of the focus ring, it is possible to suppress deterioration of the groove portion or abnormal electric discharge at the groove portion.

The bottom surface of the groove portion may be located at a height position equal to a height position of an uppermost end surface among upper end surfaces of the coolant path, or lower than the height position of the uppermost end surface among the upper end surfaces of the coolant path. In this case, since heat flux in a horizontal direction above the coolant path is blocked by the groove portion, it is possible to independently control the temperature of the target object and the temperature of the focus ring.

A height position of an upper end surface of the coolant path formed within the inner base member portion may be higher than a height position of an upper end surface of the coolant path formed within the outer base member portion, and the bottom surface of the groove portion may be located at a height position equal to the upper end surface of the coolant path formed within the inner base member portion or lower than the upper end surface of the coolant path formed within the inner base member portion. Further, a height position of an upper end surface of the coolant path formed within the inner base member portion may be lower than a height position of an upper end surface of the coolant path formed within the outer base member portion, and the bottom surface of the groove portion may be located at a height position equal to the upper end surface of the coolant path formed within the outer base member portion or lower than the upper end surface of the coolant path formed within the outer base member portion.

The mounting member may include therein the first heat transfer member. In this case, heat may be efficiently transferred to the target object. Further, the mounting member may further include therein an electrode above the first heat transfer member, and the electrode may be configured to electrostatically hold and attract the target object. As such, the mounting member may serve as an electrostatic chuck.

The mounting table may further include a spacer member provided between the focus ring and the outer base member portion, and the spacer member may include therein the second heat transfer member. In this case, heat may be efficiently transferred to the target object.

The coolant path may be arranged under the mounting member and the focus ring. In this case, it is possible to independently control the temperature of the target object and the temperature of the focus ring.

The mounting table may further include a supporting member, having through holes therein, that supports the rear surface of the base member; and fixing members to be inserted into the through holes. Further, fastening portions to be fastened with the fixing members may be formed on the rear surface of the base member, and the supporting member and the base member may be fixed to each other by fastening the fixing members to the fastening portions while the fixing members are inserted into the through holes of the supporting member. In this case, since the through holes (screw holes) for fixing the base member to the supporting member are not formed on the front surface of the base member, it is possible to suppress a region having a remarkable temperature difference. Therefore, it is possible to reduce the possibility of damage of constituent components by the thermal stress deformation, and possible to generate a great temperature difference between the target object and the focus ring, which is limited by the thermal stress deformation.

A plasma processing apparatus includes a processing chamber that partitions a processing space where plasma is generated; a gas supply unit configured to supply a processing gas into the processing space; a first electrode provided in the processing space; and a mounting table accommodated in the processing space and configured to mount thereon a target object. Further, the mounting table includes a base member, having a rear surface and a front surface facing the rear surface, in which a coolant path is formed, the rear surface being connected to a power supply member configured to apply a voltage, a groove portion having a bottom surface within the base member being annularly formed on the front surface when viewed from a direction perpendicular to the front surface, the base member being divided into a cylindrical inner base member portion positioned at an inner side of the groove portion and an annular outer base member portion positioned at an outer side of the groove portion by the groove portion; a mounting member that is supported by the inner base member portion and has a mounting surface on which the target object is mounted; an annular focus ring that is supported by the outer base member portion and arranged to surround the mounting surface when viewed from a direction perpendicular to the mounting surface, the annular focus ring having, at an inner side surface thereof, a protrusion that is protruded radially and inwardly to cover the groove portion when viewed from the direction perpendicular to the mounting surface; a first heat transfer member provided between the mounting surface and the coolant path; and a second heat transfer member provided between the focus ring and the coolant path.

According to this plasma processing apparatus, the same effects as described above with regard to the mounting table can be obtained.

In accordance with various aspects and example embodiments, it is possible to provide a mounting table and a plasma processing apparatus capable of independently controlling a temperature of a target object and a temperature of a focus ring, generating a great temperature difference between the target object and the focus ring, which is limited by thermal stress deformation, and generating a uniform sheath field on a surface of the target object and a surface of the focus ring in a simple configuration.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent from the following detailed description. The use of the same reference numbers in different figures indicates similar or identical items.

DETAILED DESCRIPTION

Figure 1:
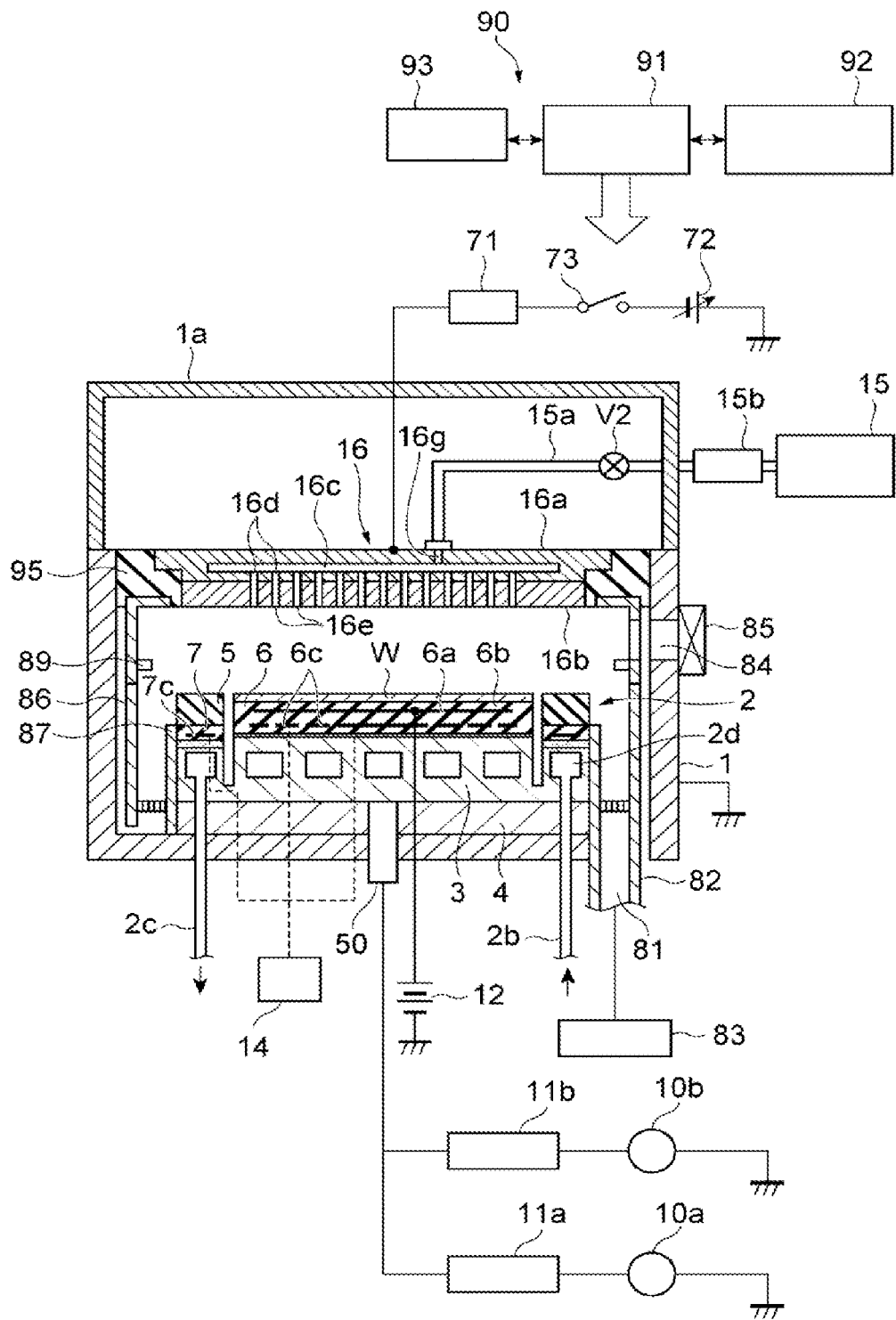
FIG. 1 is a schematic cross sectional view illustrating a configuration of a plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein. Further, the expressions "up" and "low" are connected to the situation illustrated, and utilized for convenience in the description.

FIG. 1 is a schematic cross sectional view illustrating a configuration of a plasma processing apparatus in accordance with an example embodiment. The plasma processing apparatus includes a processing chamber 1 that is airtightly provided and electrically grounded. The processing chamber 1 has a cylindrical shape and is made of, for example, aluminum. The processing chamber 1 partitions a processing space where plasma is generated. Within the processing chamber 1, there is provided a mounting table 2 configured to horizontally mount thereon a semiconductor wafer (hereinafter, simply referred to as "wafer") W serving as a target object (work piece). The mounting table 2 includes a base member 3 and an electrostatic chuck 6 (mounting member). The base member 3 is made of a conductive metal such as aluminum or the like and serves as a lower electrode. The electrostatic chuck 6 is configured to electrostatically hold and attract the wafer W. The base member 3 is supported by a supporting member 4 formed of an insulator, and the supporting member 4 is provided at a bottom portion of the processing chamber 1. Further, a focus ring 5 formed of, for example, single crystalline silicon is provided on an upper periphery of the base member 3 via a spacer member 7.

The base member 3 is connected to a power supply rod 50 (power supply member). The power supply rod 50 is connected to a first RF power supply 10a via a first matching unit 11a, and also connected to a second RF power supply 10b via a second matching unit 11b. The first RF power supply 10a is used for plasma generation and configured to supply a high frequency power having a certain frequency to the base member 3 of the mounting table 2. Further, the second RF power supply 10b is used for ion attraction (for bias) and configured to supply a high frequency power having a certain frequency lower than that of the first RF power supply 10a to the base member 3 of the mounting table 2. As such, a voltage can be applied to the mounting table 2.

The electrostatic chuck 6 includes an electrode 6a between insulators 6b, and the electrode 6a is connected to a DC power supply 12. Further, when a DC voltage is applied from the DC power supply 12 to the electrode 6a, the wafer W is held on and attracted to the electrostatic chuck 6 by a Coulomb force.

Within the electrostatic chuck 6, there are provided heaters 6c (first heat transfer member) as heating members. These heaters 6c are connected to a heater power supply 14. By way of example, the heaters 6c are annularly extended to surround a center of the mounting table 2. By way of example, the heaters 6c may include a heater configured to heat a central region and a heater annularly extended to surround an outside of the central region. In this case, it is possible to control a temperature of the wafer W at each of multiple regions positioned in a radial direction from a center of the wafer W. Further, the spacer member 7 on which the focus ring 5 is mounted is an annular member, and within the spacer member 7, a heater 7c (second heat transfer member) as a heating member is provided. The heater 7c is connected to the heater power supply 14. A temperature of the focus ring 5 is controlled by the heater 7c. As such, a temperature of the wafer W and a temperature of the focus ring 5 are controlled independently by the different heaters.

Within the base member 3, a coolant path 2d is formed, and the coolant path 2d is connected to a coolant inlet line 2b and a coolant outlet line 2c. The mounting table 2 can be controlled to have a preset temperature by circulating an adequate coolant such as cooling water or the like through the coolant path 2d. Further, a gas supply line (not illustrated) configured to supply a cold heat transfer gas (backside gas), such as a helium gas or the like, to a rear surface of the wafer W may be provided to pass through the mounting table 2 and the like. The gas supply line is connected to a non-illustrated gas supply source. With this configuration, the wafer W held and attracted on an upper surface of the mounting table 2 by the electrostatic chuck 6 can be controlled to have a preset temperature.

Meanwhile, above the mounting table 2, a shower head 16 serving as an upper electrode is provided to face the mounting table 2 in parallel to each other. The shower head 16 and the mounting table 2 are configured to serve as a pair of electrodes (upper electrode and lower electrode).

The shower head 16 is provided on a top wall of the processing chamber 1. The shower head 16 includes a main body 16a and an upper top plate 16b serving as an electrode plate. Further, the shower head 16 is supported on an upper portion of the processing chamber 1 via an insulating member 95. The main body 16a is made of a conductive material, for example, aluminum having an anodically oxidized surface and is configured to support the upper top plate 16b to be detachably attached to a lower part thereof.

A gas diffusion space 16c is formed within the main body 16a, and multiple gas through holes 16d are formed in a bottom portion of the main body 16a to be located under the gas diffusion space 16c. Further, gas discharge holes 16e passing through the upper top plate 16b in a thickness direction thereof are formed in the upper top plate 16b to be communicated to the gas through holes 16d. With this configuration, a processing gas supplied into the gas diffusion space 16c is dispersed in a shower shape and discharged into the processing chamber 1 through the gas through holes 16d and the gas discharge holes 16e.

A gas inlet opening 16g configured to introduce a processing gas into the gas diffusion space 16c is formed at the main body 16a. One end of a gas supply line 15a is connected to the gas inlet opening 16g, and a processing gas supply source (gas supply unit) 15 configured to supply a processing gas is connected to the other end of the gas supply line 15a. A mass flow controller (MFC) 15b and an opening/closing valve V2 are sequentially provided from an upstream side at the gas supply line 15a. Further, a processing gas for plasma etching is supplied into the gas diffusion space 16c through the gas supply line 15a from the processing gas supply source 15, and is dispersed in a shower shape and discharged into the processing chamber 1 through the gas through holes 16d and the gas discharge holes 16e from the gas diffusion space 16c.

A variable DC power supply 72 is electrically connected to the shower head 16 serving as the upper electrode via a low pass filter (LPF) 71. The variable DC power supply 72 is configured to turn on/off power supply by using an on/off switch 73. A current/voltage of the variable DC power supply 72 and an on/off operation of the on/off switch 73 are controlled by a control unit 90 to be explained later. Further, as will be described later, when plasma is generated in the processing space by applying a high frequency power from the first RF power supply 10a and the second RF power supply 10b to the mounting table 2, the on/off switch 73 is turned on by the control unit 90 if necessary and a preset DC voltage is applied to the shower head 16 serving as the upper electrode.

A cylindrical ground conductor 1a is provided to be extended from a side wall of the processing chamber 1 to a position higher than a height position of the shower head 16. The cylindrical ground conductor 1a includes a top wall at an upper portion thereof.

An exhaust opening 81 is formed at a bottom portion of the processing chamber 1, and a first exhaust device 83 is connected to the exhaust opening 81 via an exhaust pipe 82. The first exhaust device 83 has a vacuum pump, and an inside of the processing chamber 1 can be depressurized to a preset vacuum level by operating the vacuum pump. Meanwhile, a loading/unloading opening 84 for the wafer W is formed at the side wall of the processing chamber 1, and a gate valve 85 configured to open and close the loading/unloading opening 84 is provided at the loading/unloading opening 84.

On an inner side of the processing chamber 1, a deposit shield 86 is provided along the inner wall surface. The deposit shield 86 is configured to suppress an etching by-product (deposit) from being deposited on the processing chamber 1. At the deposit shield 86, a conductive member (GND block) 89 is provided at substantially the same height position as that of the wafer W, so that an abnormal electric discharge is suppressed. Further, at a lower end portion of the deposit shield 86, there is provided a deposit shield 87 extended along the mounting table 2. The deposit shields 86 and 87 are detachably attached.

An overall operation of the plasma processing apparatus configured as described above is controlled by the control unit 90. The control unit 90 includes a process controller 91 that includes a CPU and controls each part of the plasma processing apparatus, a user interface 92, and a storage unit 93.

The user interface 92 includes a keyboard by which a process manager inputs a command to manage the plasma processing apparatus, and a display that visibly displays an operation status of the plasma processing apparatus.

The storage unit 93 stores a recipe of a control program (software) or processing condition data for enabling various processes executed in the plasma processing apparatus to be performed under the control of the process controller 91. Then, if necessary, a desired process is performed in the plasma processing apparatus under the control of the process controller 91 by retrieving a certain recipe from the storage unit 93 in response to an instruction or the like from the user interface 92 and executing the recipe in the process controller 91. Further, the recipe of the control program, the processing condition data, or the like may be stored in a computer-readable storage medium (for example, a hard disc, a CD, a flexible disc, a semiconductor memory, or the like), or may be transmitted at any time through, for example, a dedicated line from another device and used online.

Figure 2:
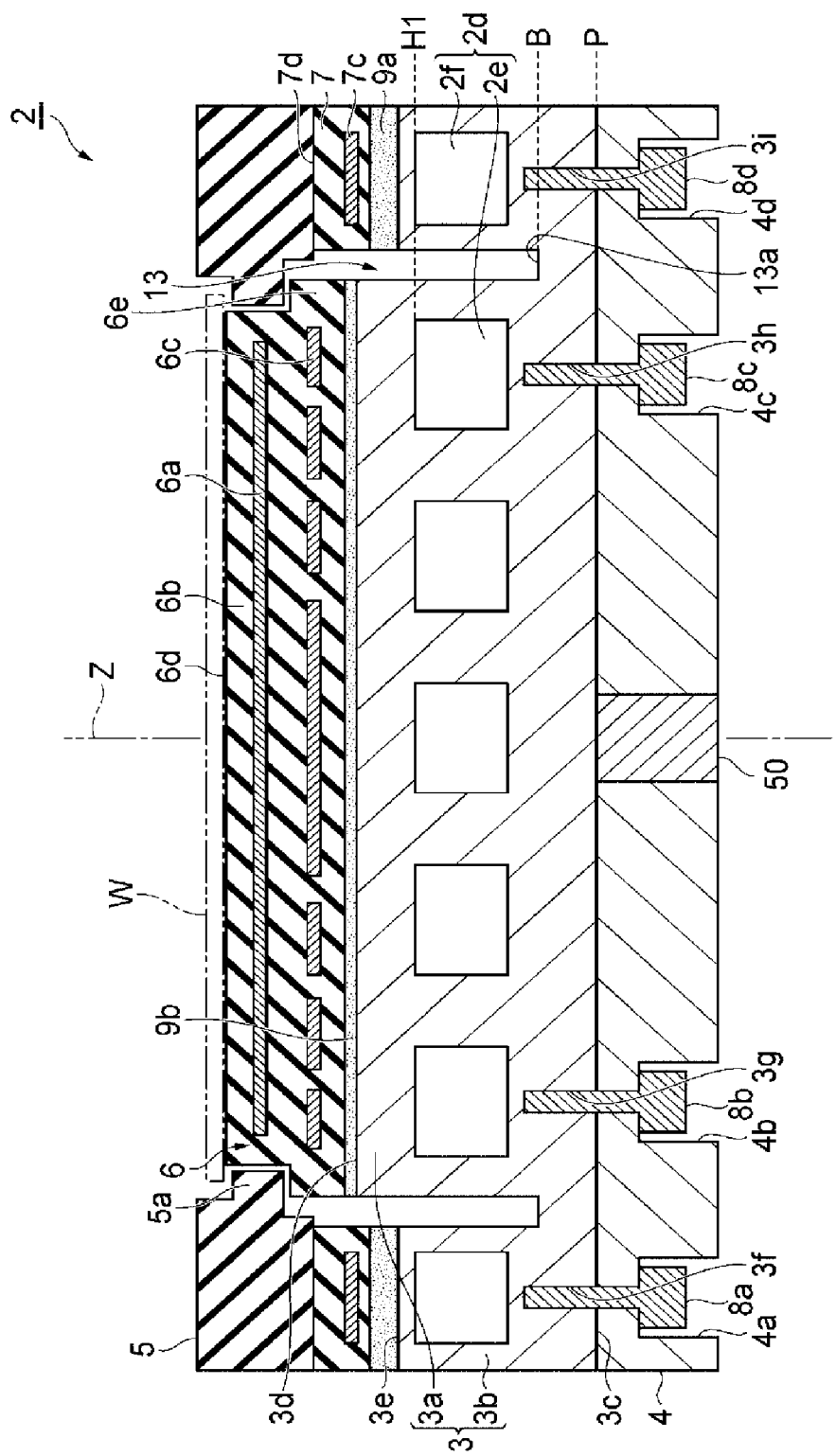
FIG. 2 is a schematic cross sectional view illustrating a mounting table of the plasma processing apparatus in FIG. 1.

Hereinafter, referring to FIG. 2, a configuration of main components of the mounting table 2 will be explained. FIG. 2 is a schematic cross sectional view illustrating the mounting table 2 of the plasma processing apparatus in FIG. 1.

For example, the base member 3 has a substantially cylindrical shape, and includes a rear surface 3c and a front surface (upper surface 3d and upper surface 3e) facing the rear surface 3c. The power supply rod 50 is connected to the rear surface 3c of the base member 3 along an axis line Z of the base member 3. Further, at the rear surface 3c of the base member 3, there are formed through holes 3f to 3i used in assembling the supporting member 4. Details of the assembly of the base member 3 and the supporting member 4 will be explained later. Although four through holes are illustrated in FIG. 2, the through holes may be formed at equivalent intervals in an annular direction or in a circumferential direction to surround the axis line Z of the base member 3. Further, in FIG. 2, the through holes 3f and 3i are annularly arranged along an outer periphery of the rear surface 3c, and the through holes 3g and 3h are annularly arranged at an inside of the through holes 3f and 3i. Herein, the through holes arranged doubly and annularly have been explained, but the arrangement of the through holes can be set appropriately. By way of example, the through holes may be formed to be arranged at only an outer periphery of the base member 3.

A groove portion 13 is annularly formed on the front surface of the base member to surround the axis line Z of the base member 3. That is, the groove portion 13 is formed in an annular manner when viewed from a direction perpendicular to the front surface of the base member 3. Further, the groove portion 13 may be continuously or intermittently formed in an annular manner. By the groove portion 13, an upper portion of the base member 3 is divided into a circular inner base member portion 3a and an annular outer base member portion 3b when viewed from the direction perpendicular to the front surface of the base member 3. An axis line of the cylindrical inner base member portion 3a is identical with the axis line Z of the base member 3. Further, the outer base member portion 3b is formed to surround the axis line Z of the base member 3, i.e. the axis line of the inner base member portion 3a. The inner base member portion 3a includes the circular upper surface 3d that supports the electrostatic chuck 6. The outer base member portion 3b includes the annular upper surface 3e that supports the focus ring 5. As such, the front surface of the base member 3 is divided into the circular upper surface 3d and the annular upper surface 3e by the groove portion 13.

Heights of the upper surface 3d and the upper surface 3e are appropriately controlled depending on a thickness of the wafer W and a thickness of the focus ring 5, or a thickness or a property of a material interposed between the wafer W and the inner base member portion 3a and a thickness or a property of a material interposed between the focus ring 5 and the outer base member portion 3b such that heat transfer or a RF power to the wafer W becomes equivalent to heat transfer or a RF power to the focus ring 5. That is, although FIG. 2 illustrates an example where the height of the upper surface 3d is not equivalent to a height of the upper surface 3e, the both heights of the upper surface 3d and the upper surface 3e may be the same.

The coolant path 2d formed within the base member 3 (see FIG. 2) includes an inner coolant path 2e arranged at an inner position of the base member 3 than the groove portion 13 and an outer coolant path 2f arranged at an outer position of the base member 3 than the groove portion 13. The inner coolant path 2e is formed under the upper surface 3d of the inner base member portion 3a. The outer coolant path 2f is formed under the upper surface 3e of the outer base member portion 3b. That is, the inner coolant path 2e is positioned under the wafer W and configured to absorb heat of the wafer W, and the outer coolant path 2f is positioned under the focus ring 5 and configured to absorb heat of the focus ring 5. Further, the inner coolant path 2e and the outer coolant path 2f may be connected to different cooling units, so that coolants having different temperatures may be flown, respectively.

The groove portion 13 includes a bottom surface 13a within the base member 3. That is, the inner base member portion 3a and the outer base member portion 3b are connected to each other under the groove portion 13. With reference to a height position P of the rear surface 3c of the base member 3, a height position B of the bottom surface 13a is equal to or lower than a height of the uppermost end surface among upper end surfaces of the coolant paths 2e and 2f. FIG. 2 illustrates an example where the upper end surfaces of the coolant paths 2e and 2f have the same height H1. For this reason, the height position B of the bottom surface 13a of the groove portion 13 may be equal to or lower than the height H1. As such, since the groove portion 13 is formed at least up to the upper end surfaces of the coolant paths 2e and 2f, a space is formed above the coolant paths 2e and 2f to interrupt physical continuity. Therefore, it is possible to suppress heat from being transferred in a horizontal direction within the base member 3. Since the space is in a vacuum state during a plasma process, it is possible to provide heat insulation by vacuum.

The electrostatic chuck 6 is provided on the upper surface 3d of the inner base member portion 3a via an adhesive 9b. The electrostatic chuck 6 has a circular plate shape and is arranged to have the same axis line as the axis line Z of the base member 3. At an upper end of the electrostatic chuck 6, there is formed a mounting surface 6d configured to mount thereon the wafer W. The mounting surface 6d has a circular shape and is brought into contact with the rear surface of the wafer W to support the circular plate-shaped wafer W. Further, at a lower end of the electrostatic chuck 6, there is formed a flange portion 6e protruding radially and outwardly from the electrostatic chuck 6. That is, an outer diameter of the electrostatic chuck 6 varies depending on a position of a side surface thereof. Further, the electrostatic chuck 6 includes the electrode 6a and the heaters 6c between the insulators 6b. In FIG. 2, the heaters 6c are provided under the electrode 6a. Heating of the mounting surface 6d is controlled by the heaters 6c. Further, the heaters 6c may not be provided within the electrostatic chuck 6. By way of example, the heaters 6c may be attached to a rear surface of the electrostatic chuck 6 with the adhesive 9b or may be provided at a portion between the mounting surface 6d and the coolant path 2e.

By way of example, the focus ring 5 is supported by the outer base member portion 3b via the spacer member 7. The focus ring 5 is a circular ring-shaped member and arranged to have the same axis line as the axis line Z of the base member 3. At the inner side surface of the focus ring 5, there is formed a protrusion 5a protruding radially and inwardly from the focus ring 5. That is, an inner diameter of the focus ring 5 varies depending on a position of an inner side surface thereof. By way of example, an inner diameter of a portion of the focus ring 5 where the protrusion 5a is not formed is greater than an outer diameter of the wafer W and an outer diameter of the flange portion 6e of the electrostatic chuck 6. Meanwhile, an inner diameter of a portion of the focus ring 5 where the protrusion 5a is formed is smaller than the outer diameter of the flange portion 6e of the electrostatic chuck 6 and greater than an outer diameter of a portion of the electrostatic chuck 6 where the flange portion 6e is not formed.

The focus ring 5 is arranged on an upper surface of the spacer member 7 such that the protrusion 5a is spaced from an upper surface of the flange portion 6e of the electrostatic chuck 6 and also spaced from a side surface of the electrostatic chuck 6. That is, there is formed a gap between a lower surface of the protrusion 5a of the focus ring 5 and the upper surface of the flange portion 6e of the electrostatic chuck 6, and between a side surface of the protrusion 5a of the focus ring 5 and the side surface of the electrostatic chuck 6 where the flange portion 6e is not formed. Further, the protrusion 5a of the focus ring 5 is positioned above the groove portion 13. That is, when viewed from a direction perpendicular to the mounting surface 6d, the protrusion 5a is positioned to be overlapped with the groove portion 13 and covers the groove portion 13. Thus, it is possible to suppress plasma from being introduced into the groove portion 13.

The spacer member 7 is an annular member and arranged to have the same axis line as the axis line Z of the base member 3. The spacer member 7 is provided on the upper surface 3e of the outer base member portion 3b via an adhesive 9a. The spacer member 7 is made of an insulator such as ceramic or the like. An upper surface 7d of the spacer member 7 is brought into contact with the focus ring 5 to support the focus ring 5. The focus ring 5 is supported by the spacer member 7 and arranged to surround the wafer W (the mounting surface 6d of the electrostatic chuck 6). The spacer member 7 includes therein the heater 7c. Heating of the upper surface 7d (a mounting surface of the focus ring 5) of the spacer member 7 is controlled by the heater 7c. Further, the heater 7c may not be provided within the spacer member 7. By way of example, the heater 7c may be attached to a rear surface of the spacer member 7 with the adhesive 9a or may be provided at a portion between the focus ring 5 and the coolant path 2f.

The base member 3 is supported by the cylindrical supporting member 4 made of an insulator such as ceramic or the like. The supporting member 4 includes through holes 4a to 4d through which screws are inserted to be passed through from a rear surface of the supporting member 4. The through holes 4a to 4d are formed to correspond to the through holes 3f to 3i of the base member 3. At an inner side of the through holes 3f to 3i of the base member 3, there are formed screw portions (fastening portions) to be fastened with screws 8a to 8d (fixing members). Further, at the through holes 4a to 4d, there may be formed screw portions (fastening portions) to be fastened with the screws 8a to 8d (fixing members). The base member 3 and the supporting member 4 are arranged such that the through holes 4a to 4d of the supporting member are overlapped with the through holes 3f to 3i of the base member 3, and the base member 3 and the supporting member 4 are screw-fixed by inserting the screws 8a to 8d to be passed through from the rear surface of the supporting member 4. As a result, the base member 3 and the supporting member 4 are connected and fixed to each other.

Figure 3:
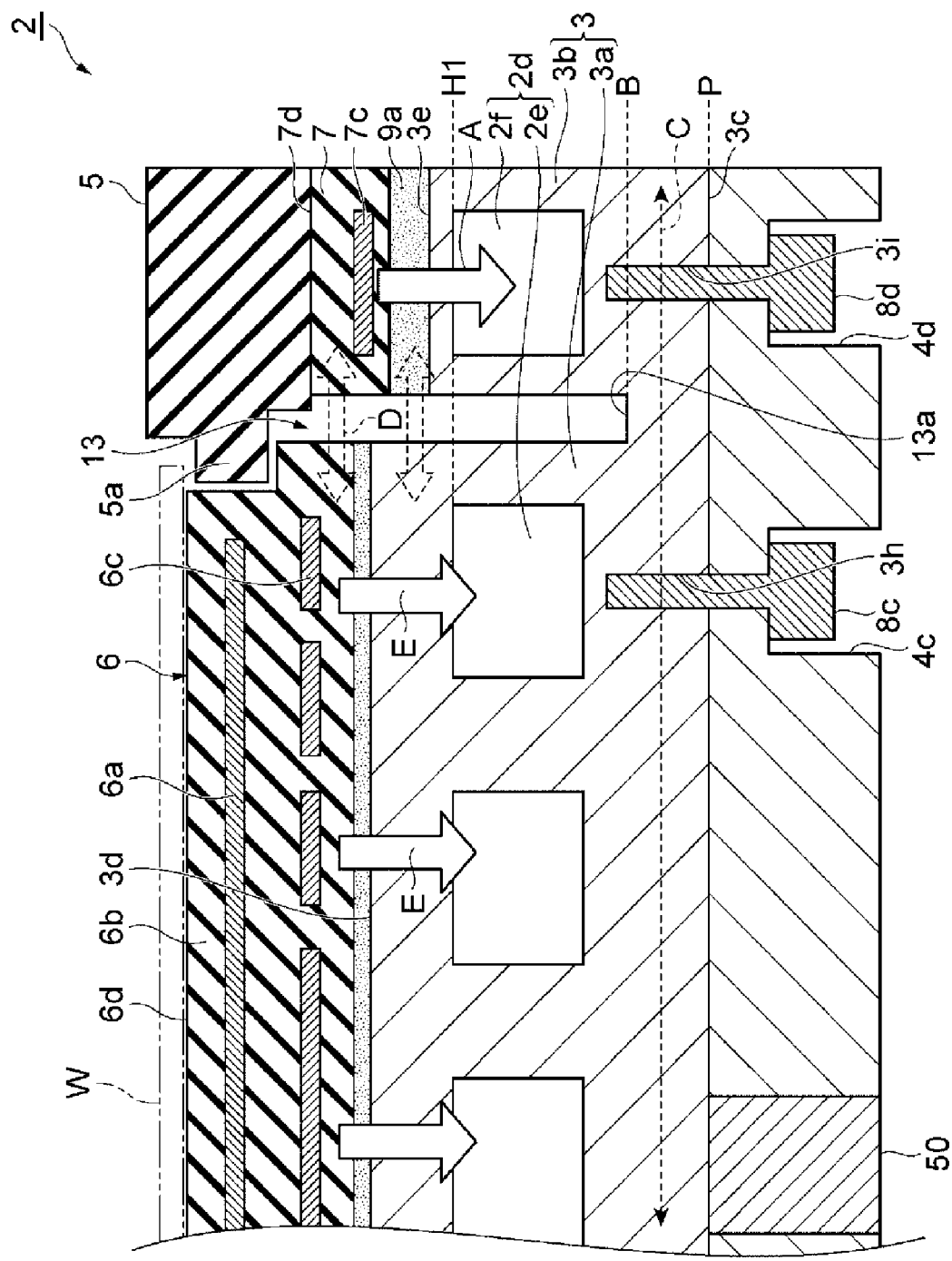
FIG. 3 is a schematic diagram for explaining an operation and effect of the mounting table of the plasma processing apparatus in FIG. 1.

Hereinafter, referring to FIG. 3, an operation and effect of the mounting table 2 will be explained. FIG. 3 is a schematic diagram for explaining an operation and effect of the mounting table 2. As depicted in FIG. 3, in the mounting table 2, the electrostatic chuck 6 is supported by the inner base member portion 3a, and the focus ring 5 is supported by the outer base member portion 3b. By the groove portion 13 (space) which separates the inner base member portion 3a and the outer base member portion 3b, the electrostatic chuck 6 and the focus ring 5 are thermally separated from each other. For this reason, heat transfer in a horizontal direction (in a diametrical direction of the mounting table 2) indicated by an arrow D is suppressed, and heat of the wafer W is transferred from the electrostatic chuck 6 to the inner coolant path 2e, i.e. in a vertical direction, as indicated by an arrow E. Likewise, heat of the focus ring 5 is transferred to the outer coolant path 2f, i.e. in a vertical direction, as indicated by an arrow A. As such, heat transfer between the members positioned above the bottom surface 13a of the groove portion 13 is suppressed. By way of example, by forming the space, the wafer W, the electrostatic chuck 6, the adhesive 9b, and a portion of the inner base member portion 3a between the upper surface 3d of the inner base member portion 3a and the an upper end surface of the inner coolant path 2e are separated from the focus ring 5, the spacer member 7, the adhesive 9a, and a portion of the outer base member portion 3b between the upper surface 3e of the outer base member portion 3b and the upper end surface of the outer coolant path 2f. As a result, heat transfer therebetween is suppressed. For this reason, it is possible to independently control the temperature of the wafer W and the temperature of the focus ring 5.

Further, since the inner base member portion 3a and the outer base member portion 3b are separated from each other with the space, i.e., the groove portion 13, even if there is a difference in thermal expansion between the inner base member portion 3a and the outer base member portion 3b, and between the electrostatic chuck 6 and the focus ring 5, the constituent components are not damaged by thermal stress deformation. Furthermore, the screws 8c and 8d are inserted from a side of the rear surface 3c of the base member 3. Thus, since the through holes (or screw holes) for fixing the base member 3 to the supporting member 4 are not formed on the front surface of the base member 3, the heaters 6c and 7c can be arranged uniformly. As a result, it is possible to suppress a region having a remarkable temperature difference. Therefore, it is possible to reduce the possibility of damage of the constituent components by the thermal stress deformation, and possible to generate a great temperature difference between the wafer W and the focus ring 5, which is limited by the thermal stress deformation. As such, the groove portion 13 has not only a function of insulating the heat transfer, but also a function of absorbing the thermal stress deformation.

Furthermore, since the power supply rod 50 is connected to the rear surface 3c of the base member 3 and the groove portion 13 includes the bottom surface 13a within the base member 3, the inner base member portion 3a and the outer base member portion 3b are connected to each other under the groove portion 13 as indicated by an arrow C. As such, the inner base member portion 3a and the outer base member portion 3b are connected to each other as a RF circuit. Therefore, it is possible to generate a uniform sheath field on a surface of the wafer W and a surface of the focus ring 5 in a simple configuration.

Moreover, since plasma to be introduced into the groove portion 13 is blocked by the protrusion 5a formed at the inner side surface of the focus ring 5, it is possible to suppress deterioration of the groove portion or abnormal electric discharge at the groove portion 13.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

Figure 4:
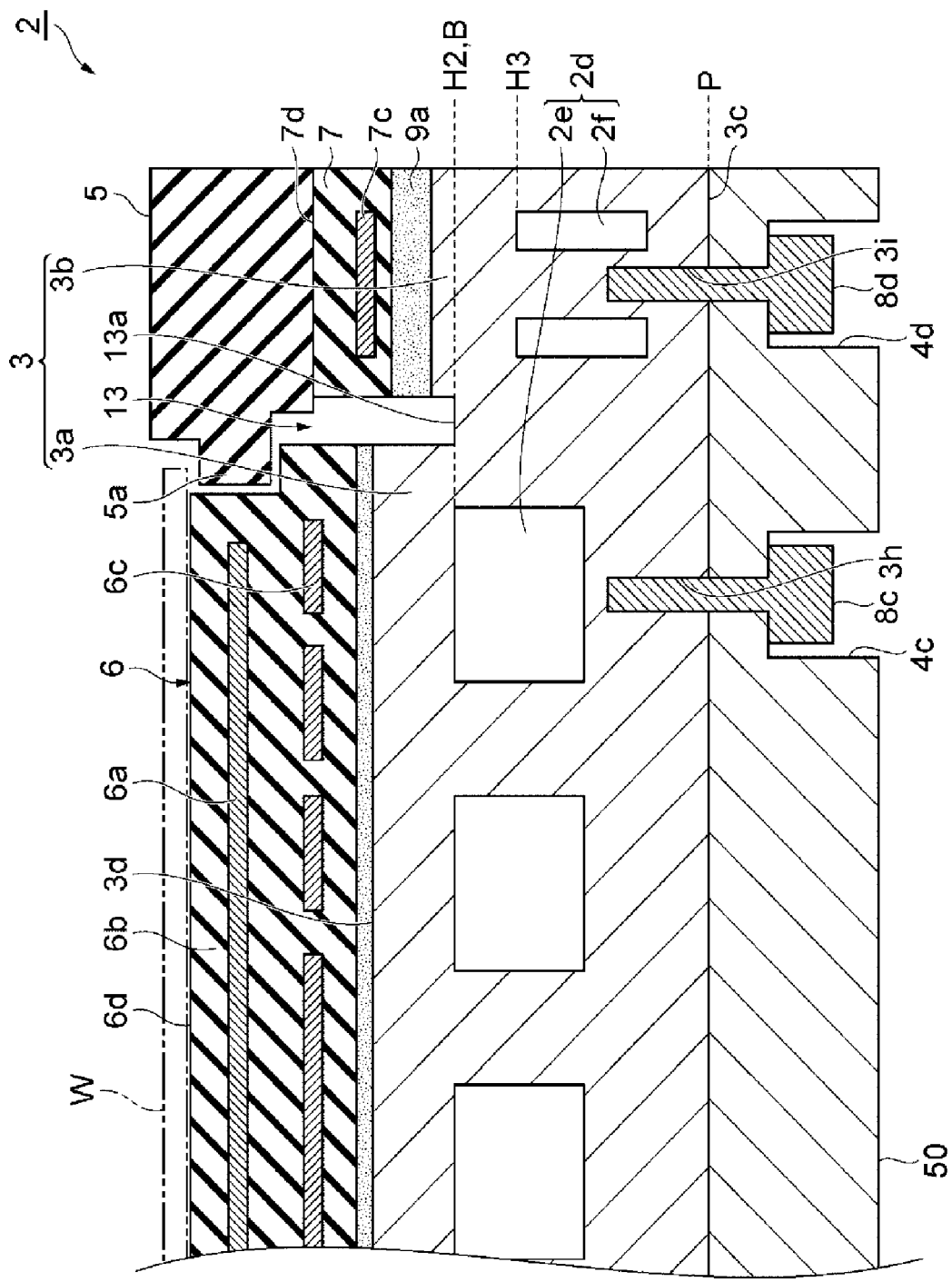
FIG. 4 illustrates a modification example of the mounting table of the plasma processing apparatus in accordance with the example embodiment.
Figure 5:
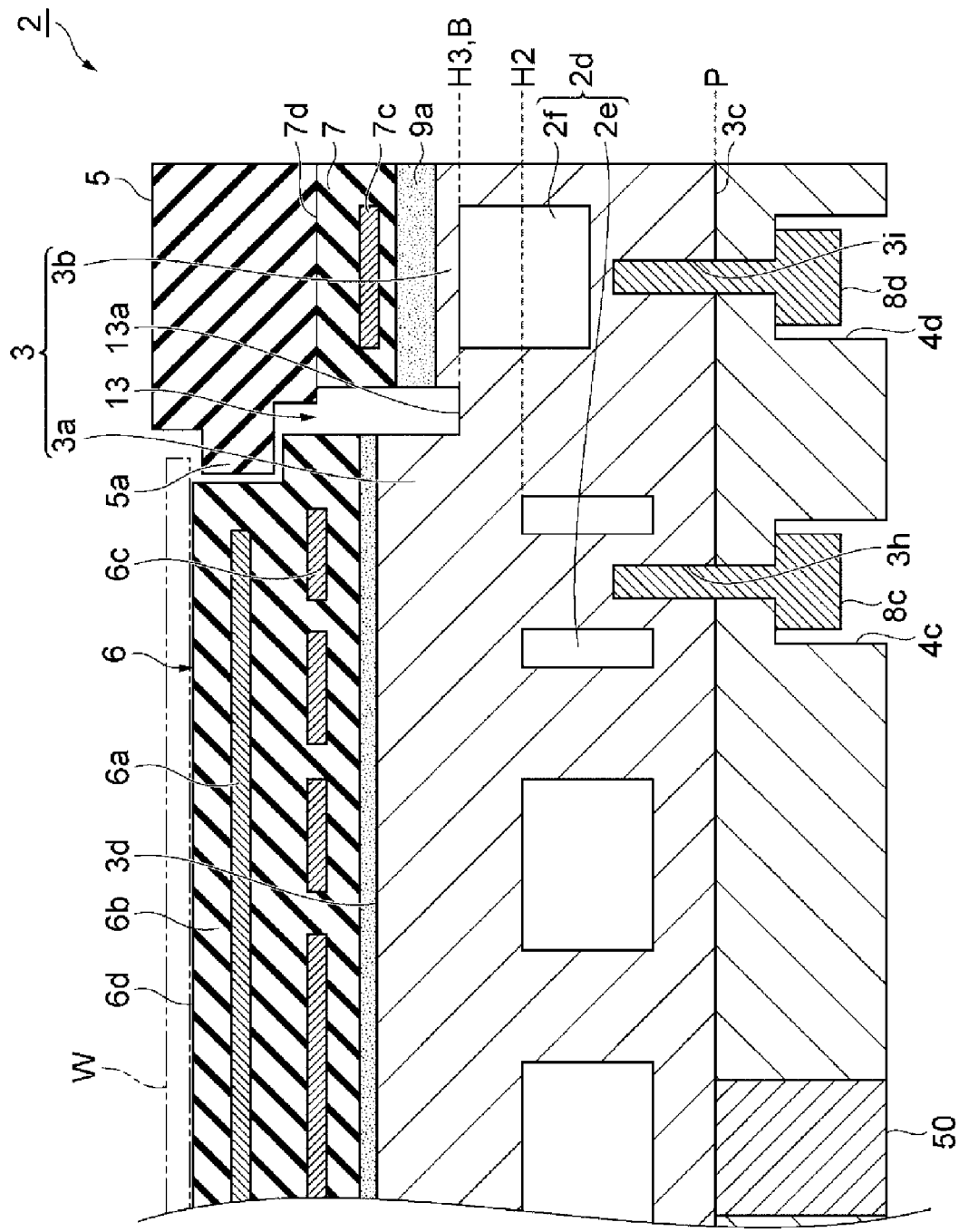
FIG. 5 illustrates another modification example of the mounting table of the plasma processing apparatus in accordance with the example embodiment.
Figure 6A:
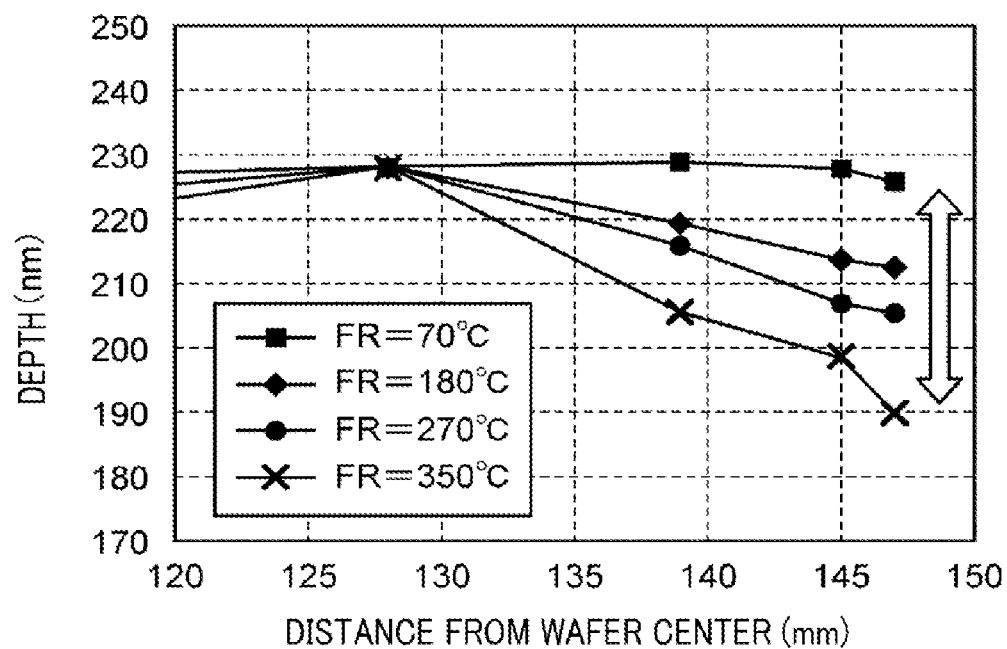
FIGS. 6A and 6B are graphs showing a dependency of a working shape of a wafer as a target object on a distance from a wafer center.
Figure 6B:
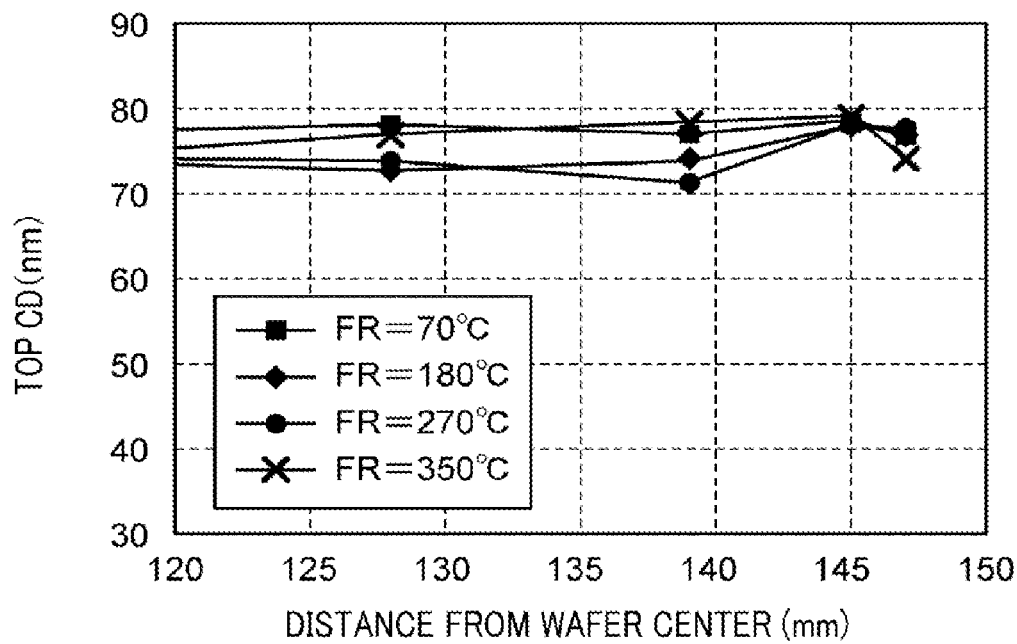
Figure 7A:
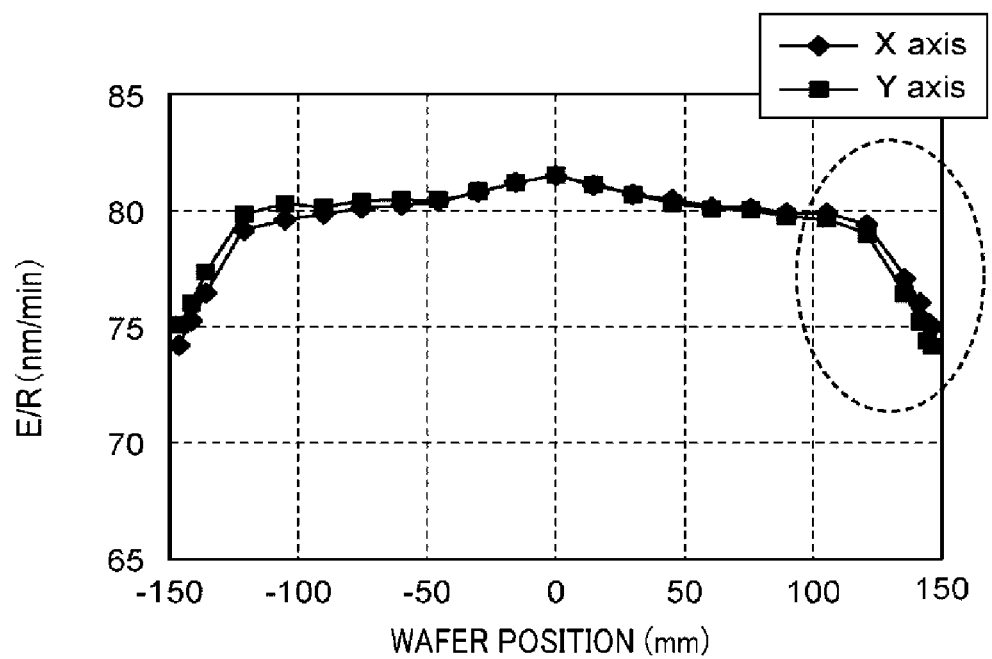
FIG. 7A and FIG. 7B are graphs showing a dependency of an etching rate (E/R) on a wafer position.
Figure 7B:
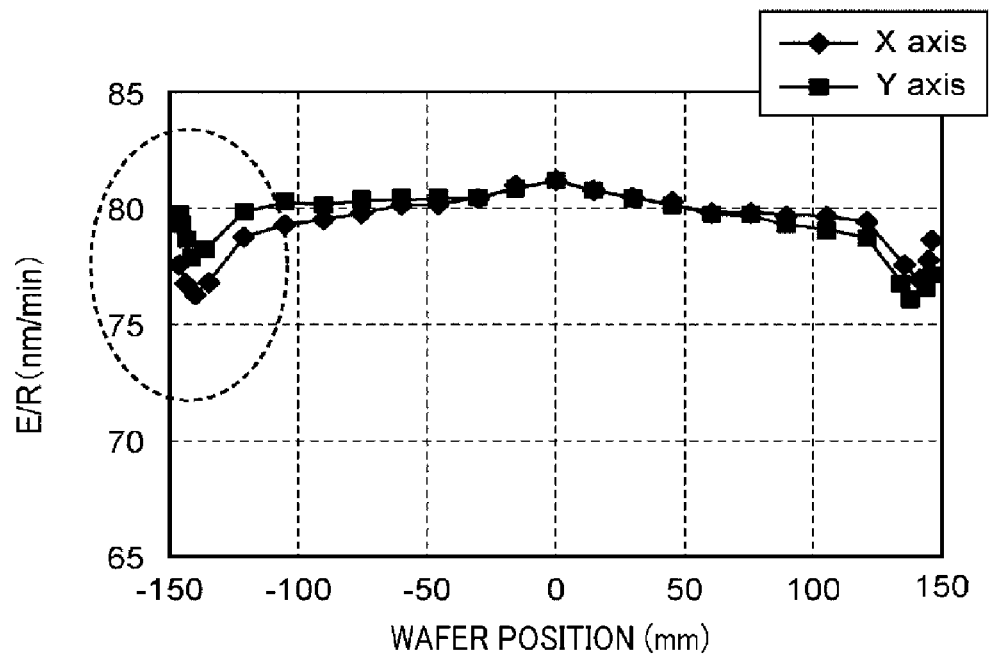
Figure 8:
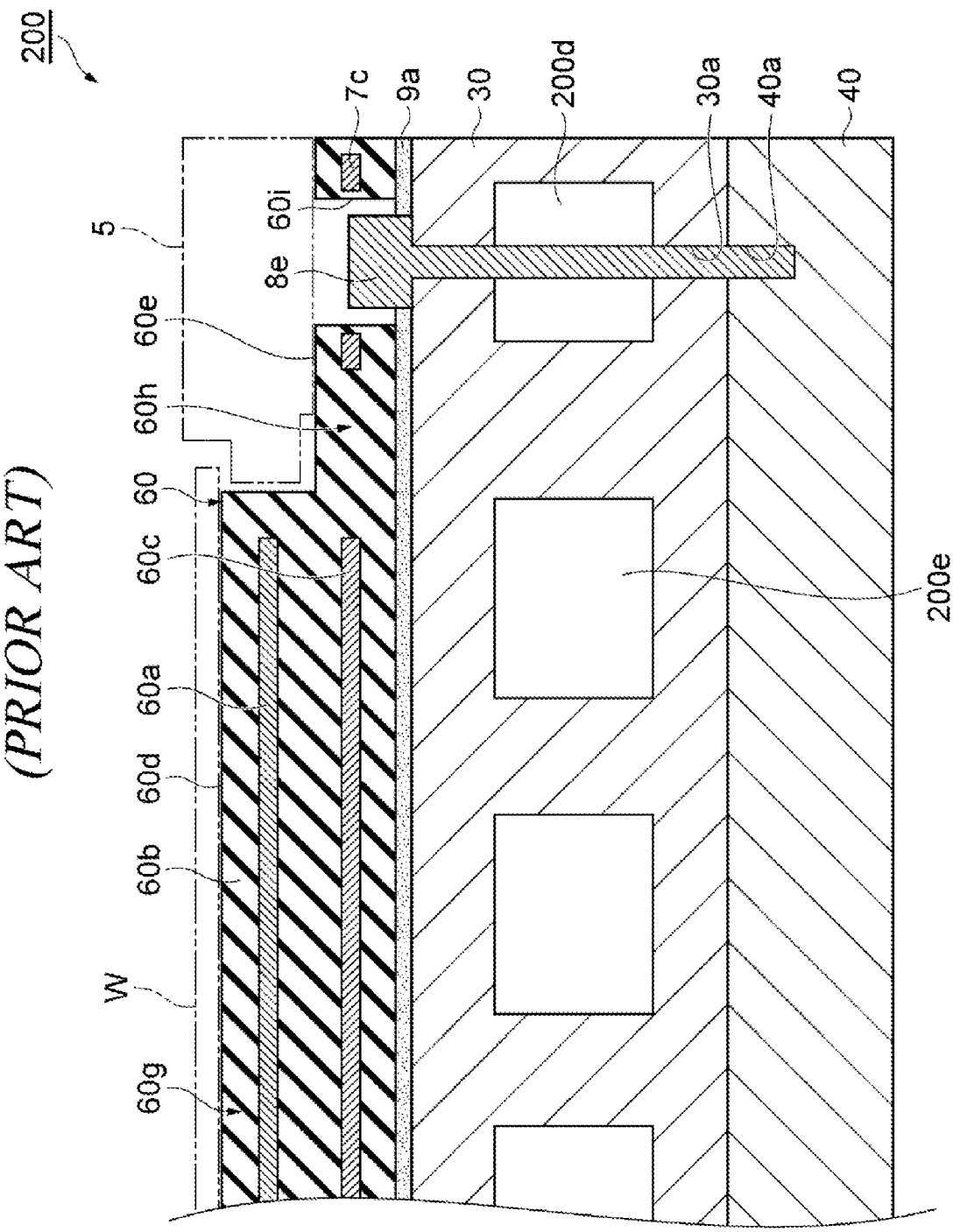
FIG. 8 is a schematic cross sectional view illustrating a configuration of a conventional mounting table.
Figure 9:
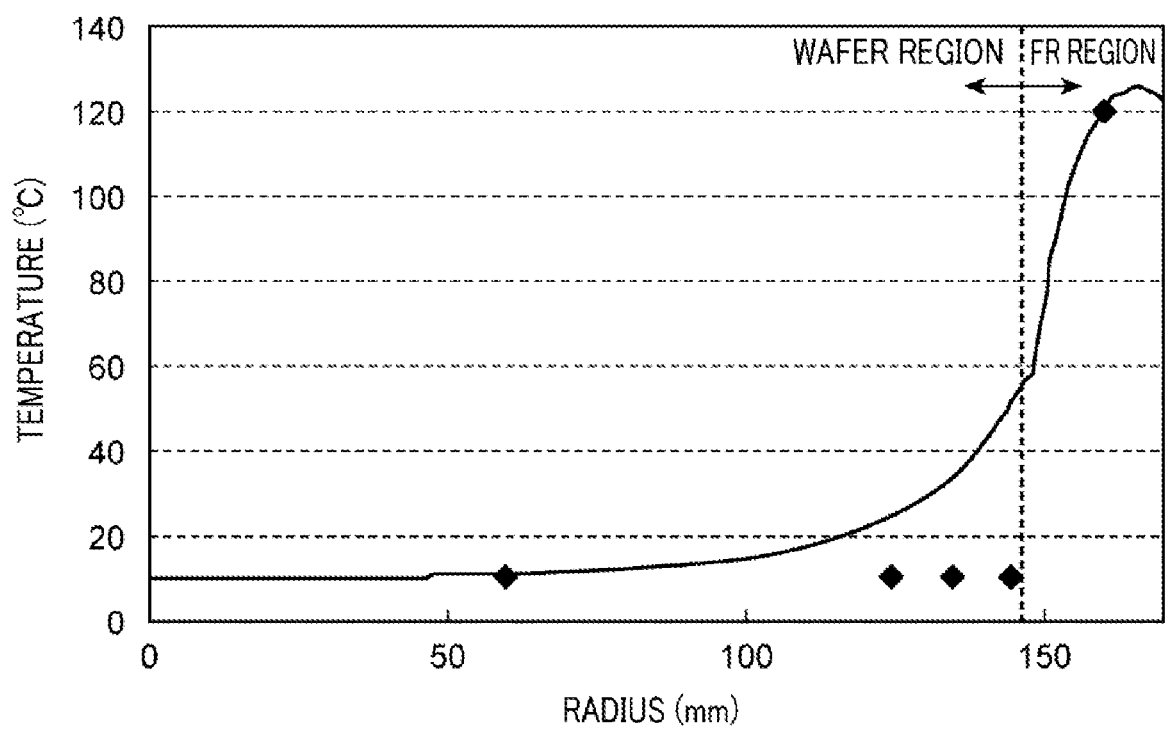
FIG. 9 is a graph showing temperatures measured at each distance (radius) from a center of a mounting table.
Figure 10:
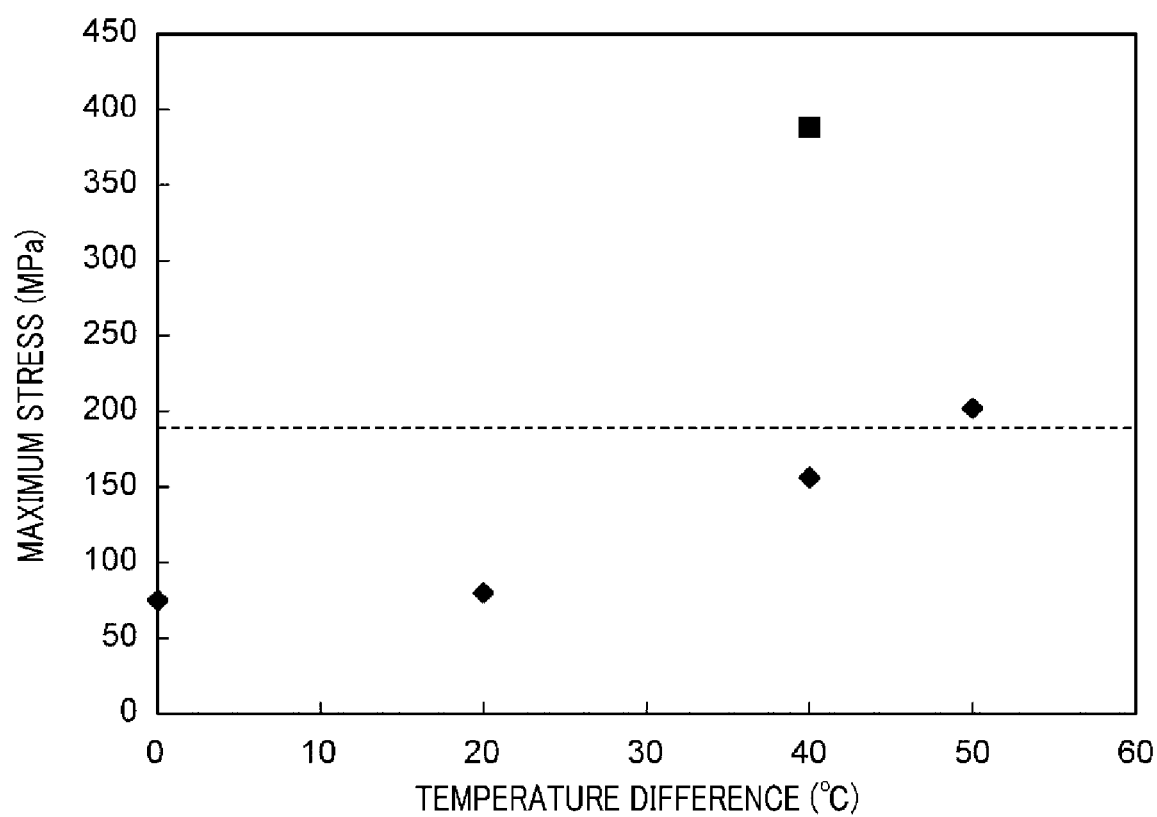
FIG. 10 is a graph showing a correlation between a maximum stress generated at an electrostatic chuck and a temperature difference.

By way of example, as depicted in FIG. 4, a height H2 of the upper end surface of the inner coolant path 2e within the base member 3 may be higher than a height H3 of the upper end surface of the outer coolant path 2f. In this case, the height B of the bottom surface 13a of the groove portion 13 may be equal to or lower than the height H2 of the upper end surface of the coolant path 2e at the uppermost end surface among the upper end surfaces of the coolant paths 2e and 2f. Further, by way of example, as depicted in FIG. 5, the height H2 of the upper end surface of the inner coolant path 2e within the base member 3 may be lower than the height H3 of the upper end surface of the outer coolant path 2f. In this case, the height B of the bottom surface 13a of the groove portion 13 may be equal to or lower than the height H3 of the upper end surface of the coolant path 2f at the uppermost end surface among the upper end surfaces of the coolant paths 2e and 2f. As such, the bottom surface 13a of the groove portion 13 is located at a height position cutting off a heat flow path that is formed in the aluminum base member portion or the like above the outer coolant path 2f and the inner coolant path 2e in a horizontal direction.

Further, although the base member 3 is described to be formed as one single body in the above example embodiments, separate bodies may be combined to serve as the base member 3. By way of example, the outer base member portion 3b may be a separate body. If the outer base member portion 3b is a separate body, a surface treatment such as a thermal spraying treatment can be easily performed on the inside of the groove portion 13.

Furthermore, the plasma processing apparatus may use plasma generated with microwave.

We claim:

1. A mounting table that mounts thereon a target object, comprising:
a base member having a rear surface and a front surface facing the rear surface;
a coolant path formed within the base member;
a groove portion formed within the base member, the groove portion having a bottom surface and having an annular shape when viewed from a direction perpendicular to the front surface, the groove portion dividing the base member into a cylindrical inner base member portion positioned at an inner side of the groove portion and an annular outer base member portion positioned at an outer side of the groove portion, a rear surface of the cylindrical inner base member portion being connected to a power supply member configured to apply a voltage;
a mounting member supported by the inner base member portion and having a mounting surface on which the target object is mounted;
a focus ring;
a focus ring support member supported by the outer base member portion and arranged to support the focus ring;
a first heater provided between the mounting surface and the coolant path;
a second heater provided on or in the focus ring support member; and
a RF power supply connected to the power supply member,
wherein the cylindrical inner base member portion and the annular outer base member portion are connected to each other under the groove portion, such that the cylindrical inner base member portion and the annular outer base member portion are formed as an integral body,
the base member is made of a conductive metal, such that the cylindrical inner base member portion and the annular outer base member portion are electrically connected to each other as a RF circuit,
the groove portion and the coolant path are separated from each other within the base member so as to suppress heat from the second heater from being transferred toward the cylindrical inner base member portion within the base member,
the bottom surface of the groove portion is formed at a height position equal to or lower than a height position of an uppermost end surface among upper end surfaces of the coolant path such that a space is formed above the uppermost end surface of the coolant path to suppress heat from being transferred in a horizontal direction within the base member,
the coolant path includes an inner coolant path arranged at the cylindrical inner base member portion and an outer coolant path arranged at the annular outer base member portion, and
an upper end surface of the outer coolant path is positioned below a surface of the annular outer base member portion.

2. The mounting table of claim 1,
wherein a height position of an upper end surface of the coolant path formed within the inner base member portion is higher than a height position of an upper end surface of the coolant path formed within the outer base member portion, and
the bottom surface of the groove portion is located at a height position equal to the upper end surface of the coolant path formed within the inner base member portion or lower than the upper end surface of the coolant path formed within the inner base member portion.

3. The mounting table of claim 1,
wherein a height position of an upper end surface of the coolant path formed within the inner base member portion is lower than a height position of an upper end surface of the coolant path formed within the outer base member portion, and
the bottom surface of the groove portion is located at a height position equal to the upper end surface of the coolant path formed within the outer base member portion or lower than the upper end surface of the coolant path formed within the outer base member portion.

4. The mounting table of claim 1,
wherein the mounting member includes therein the first heater.

5. The mounting table of claim 4,
wherein the mounting member further includes therein an electrode above the first heater, and the electrode is configured to electrostatically hold and attract the target object.

6. The mounting table of claim 1,
wherein the coolant path is arranged under the mounting member and the focus ring.

7. The mounting table of claim 1, further comprising:
a supporting member, having through holes therein, that supports the rear surface of the base member; and
fixing members to be inserted into the through holes,
wherein fastening portions to be fastened with the fixing members are formed on the rear surface of the base member, and
the supporting member and the base member are fixed to each other by fastening the fixing members to the fastening portions while the fixing members are inserted into the through holes of the supporting member.

8. The mounting table of claim 7,
wherein the fastening portions and the through holes are respectively provided on the inner base member portion and the outer base member portion, and
the inner base member portion and the outer base member portion are fixed to the supporting member by the fixing members.

9. The mounting table of claim 7,
wherein the supporting member is formed of an insulator.

10. The mounting table of claim 1,
wherein the mounting member has a flange portion protruded radially and outwardly at a lower part of the mounting member,
a protrusion of the focus ring is extended to cover an upper surface of the flange portion of the mounting member, and
a gap is formed between a lower surface of the protrusion of the focus ring and the upper surface of the flange portion, and the gap is extended to the groove portion.

11. The mounting table of claim 1,
wherein the groove portion is continuously formed within the base member.

12. The mounting table of claim 11,
wherein the protrusion of the focus ring is not in contact with the cylindrical inner base member portion.

13. The mounting table of claim 1,
wherein a bottom surface of the groove portion is located at a height position equal to a lowermost end surface among lower end surfaces of the coolant path or lower than the lowermost end surface of the coolant path.

14. The mounting table of claim 1,
wherein the inner coolant path and the outer coolant path are respectively connected to different cooling units.

15. A plasma processing apparatus comprising:
a processing chamber that partitions a processing space where plasma is generated;
a gas supply unit configured to supply a processing gas into the processing space;
a first electrode provided in the processing space; and
a mounting table accommodated in the processing space and configured to mount thereon a target object,
wherein the mounting table comprises:
a base member having a rear surface and a front surface facing the rear surface,
a coolant path formed within the base member,
a groove portion formed within the base member, the groove portion having a bottom surface and having an annular shape when viewed from a direction perpendicular to the front surface, the groove portion dividing the base member into a cylindrical inner base member portion positioned at an inner side of the groove portion and an annular outer base member portion positioned at an outer side of the groove portion, a rear surface of the cylindrical inner base member portion being connected to a power supply member configured to apply a voltage;
a mounting member supported by the inner base member portion and having a mounting surface on which the target object is mounted;
a focus ring;
a focus ring support member supported by the outer base member portion and arranged to support the focus ring;
a first heater provided between the mounting surface and the coolant path;
a heater provided on or in the focus ring support member; and
a RF power supply connected to the power supply member,
wherein the cylindrical inner base member portion and the annular outer base member portion are connected to each other under the groove portion, such that the cylindrical inner base member portion and the annular outer base member portion are formed as an integral body,
the base member is made of a conductive metal, such that the cylindrical inner base member portion and the annular outer base member portion are electrically connected to each other as a RF circuit,
the groove portion and the coolant path are separated from each other within the base member so as to suppress heat from the second heater from being transferred toward the cylindrical inner base member portion within the base member,
the bottom surface of the groove portion is formed at a height position equal to or lower than a height position of an uppermost end surface among upper end surfaces of the coolant path such that a space is formed above the uppermost end surface of the coolant path to suppress heat from being transferred in a horizontal direction within the base member,
the coolant path includes an inner coolant path arranged at the cylindrical inner base member portion and an outer coolant path arranged at the annular outer base member portion, and
an upper end surface of the outer coolant path is positioned below a surface of the annular outer base member portion.

16. The plasma processing apparatus of claim 15,
wherein the mounting member has a flange portion protruded radially and outwardly at a lower part of the mounting member,
a protrusion of the focus ring is extended to cover an upper surface of the flange portion of the mounting member, and
a gap is formed between a lower surface of the protrusion of the focus ring and the upper surface of the flange portion, and the gap is extended to the groove portion.

17. The plasma processing apparatus of claim 15,
wherein the groove portion is continuously formed within the base member.
18. The plasma processing apparatus of claim 17,
wherein the protrusion of the focus ring is not in contact with the cylindrical inner base member portion.
19. The mounting table of claim 15,
wherein the inner coolant path and the outer coolant path are respectively connected to different cooling units.

* * * * *